United States Patent [19]
Ichihara

[11] Patent Number: 5,307,207
[45] Date of Patent: Apr. 26, 1994

[54] ILLUMINATING OPTICAL APPARATUS

[75] Inventor: Yutaka Ichihara, Yokohama, Japan

[73] Assignee: Nikon Corporation, Tokyo, Japan

[21] Appl. No.: 780,850

[22] Filed: Oct. 23, 1991

Related U.S. Application Data

[63] Continuation of Ser. No. 617,267, Nov. 21, 1990, abandoned, which is a continuation of Ser. No. 537,008, Jun. 13, 1990, abandoned, which is a continuation of Ser. No. 322,207, Mar. 13, 1989, abandoned.

[30] Foreign Application Priority Data

Mar. 16, 1988 [JP] Japan .................................. 63-60299
Apr. 11, 1988 [JP] Japan .................................. 63-88453

[51] Int. Cl.⁵ .................. G02B 27/10; F21V 5/00; G03B 21/00
[52] U.S. Cl. .................. 359/622; 359/619; 362/259; 362/268; 353/122
[58] Field of Search ........................ 350/171-174, 350/141, 415, 442, 235-237, 167, 169, 574, 576; 362/30, 259, 268, 32, 333; 353/28, 29, 85, 102, 121, 122, 38, 97-98; 250/548; 359/19, 20, 196-197, 205-214, 618-624, 649, 663; 355/67, 71, 52-55

[56] References Cited

U.S. PATENT DOCUMENTS

| | | | |
|---|---|---|---|
| 3,650,608 | 3/1972 | Baker | 353/121 |
| 3,964,825 | 6/1976 | Escaler | 350/161 |
| 4,035,068 | 7/1977 | Rawson | 353/122 |
| 4,155,630 | 5/1979 | Ih | 353/122 |
| 4,497,013 | 1/1985 | Ohta | 362/268 |
| 4,497,015 | 1/1985 | Konno et al. | 350/167 |
| 4,619,508 | 10/1986 | Shibuya et al. | 353/122 |
| 4,648,695 | 3/1987 | Mizutani et al. | 353/85 |
| 4,769,750 | 9/1988 | Matsumoto et al. | 362/268 |
| 4,819,033 | 4/1989 | Yoshitake et al. | 355/67 |
| 4,851,978 | 7/1989 | Ichihara | 362/268 |
| 4,918,583 | 4/1990 | Kudo et al. | 350/167 |
| 4,939,630 | 7/1990 | Kikuchi et al. | 362/268 |
| 4,970,546 | 11/1990 | Suzuki et al. | 355/71 |
| 4,974,919 | 12/1990 | Muraki et al. | 350/169 |
| 4,998,191 | 3/1991 | Tejima et al. | 362/268 |
| 5,016,149 | 5/1991 | Tanaka et al. | 362/268 |
| 5,048,926 | 9/1991 | Tanimoto | 359/618 |
| 5,253,110 | 10/1993 | Ichihara et al. | 359/619 |

*Primary Examiner*—Bruce Y. Arnold
*Assistant Examiner*—Thong Nguyen
*Attorney, Agent, or Firm*—Shapiro and Shapiro

[57] ABSTRACT

An illuminating optical apparatus comprises a stable resonator type laser equipped with a wavelength selecting element and a device for vibrating the beam one-dimensionally in a direction crossing the longer direction of the beam cross section at at least one of the entrance side and exit side of a fly's eye lens or optical integrator.

23 Claims, 10 Drawing Sheets

ILLUMINATING OPTICAL APPARATUS

This is a continuation of application Ser. No. 617,267 filed Nov. 21, 1990, which is a continuation of application Ser. No. 537,008 filed Jun. 13, 1990, which is a continuation application of Ser. No. 322,207 filed Mar. 13, 1989, all of which are abandoned.

BACKGROUND OF THE INVENTION

1. Field of the Invention

The present invention relates to an illuminating optical apparatus utilizing a coherent light beam such as an excimer laser beam, adapted for use in an exposure apparatus for semiconductor device manufacture or the like.

2. Related Background Art

As the light source for the exposure apparatus employed in the manufacture of integrated circuits, there have principally been employed ultra-high pressure mercury lamps. However, the recent remarkable progress in the level of integration of such integrated circuits is requiring an ever increasing precision on the line width. For this reason ultra-high pressure mercury lamps are starting to be replaced by high power lasers of shorter wavelength such as excimer lasers, as the light source.

Figure 1:
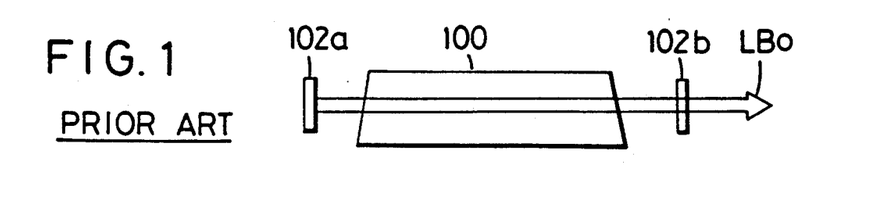
FIG. 1 is a schematic view of a stable resonance type laser.

The excimer lasers can be classified into two categories, one of which is called a stable resonator type. In this type, as shown in FIG. 1, a resonator is composed of a discharge lamp 100 for causing induced emission, with two resonator mirrors 102a, 102b positioned at opposite ends. The light reciprocates between the mirrors whereby the amplitude of the induced emission is intensified to emit a laser beam $LB_0$. The laser beam emitted from such laser is characterized by low coherence in space and time. The low coherence in time signifies a wide half value width of the spectrum ($\Delta\lambda \cong 0.4$ nm). For use in the exposure apparatus for semiconductor device manufacture, such light source requires correction of color aberration in the projection lens, and it is difficult to provide a practical lens in such short wavelength range.

Figure 2:
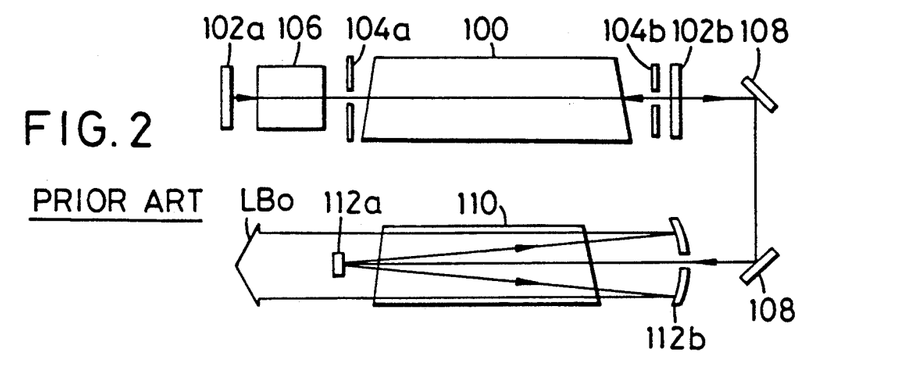
FIG. 2 is a schematic view of an injection locking type laser.

The other light source is called an injection lock type, which is divided into an oscillator and an amplifier as shown in FIG. 2. The oscillator is provided with oscillator mirrors 102a, 102b as in the above-mentioned stable resonator type. However, in the injection lock type, the oscillator is further provided with a wavelength selecting element 106 such as an etalon and a diffraction grating, and with apertures 104a, 104b at opposite ends of the discharge tube 100 for the purpose of intercepting the laser beam in a predetermined area, whereby the emitted laser beam has a narrower half-value width of the spectrum ($\Delta\lambda \cong 0.001$ nm) or improved monochromaticity. In addition the emitted laser beam is reflected by mirrors 108 and is amplified by unstable resonator mirrors 112a, 112b with mutually opposed convex and concave faces, positioned at opposite ends of a second discharge tube 110. One of the features of the laser beam from such laser is the improved monochromaticity with high coherence in time, whereby the correction of color aberration can be dispensed with in the projection lens.

For this reason the projection lens can be manufactured with a single material (quartz), so that the designing and manufacture are easy. However another feature of the injection locking laser is an extremely high coherence in space due to the amplification by the unstable resonator, and the use of such laser will result in marked interference fringes in the exposed area.

Figure 3:
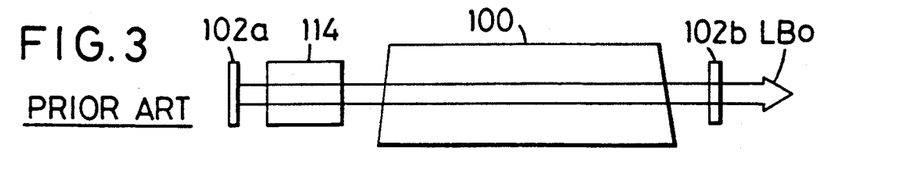
FIG. 3 is a schematic view of a stable resonance type laser equipped with a wavelength selecting element.

For avoiding such inconvenience, there has been developed a new type of laser as shown in FIG. 3, which is composed of the aforementioned stable resonator laser and a wavelength selecting element 114 for reducing the wavelength band width, such as an etalon, a prism or a diffraction grating, whereby the emitted laser beam has a narrower width of spectrum ($\Delta\lambda \cong 0.003$ nm). The laser beam from such laser has an improved coherence in time due to the presence of the wavelength selecting element 114, and a lower coherence in space in comparison with that from the injection locking type.

U.S. Pat. No. 4,619,508 discloses a method for reducing speckles resulting from the interference of a laser beam, by providing a rotating mirror or the like in the optical path of the illuminating system for causing two-dimensional scanning motion of the beam, thereby reducing the coherence in space.

Also U.S. patent application Ser. No. 135,378 filed Dec. 21, 1987 (now U.S. Pat. No. 4,851,978 issued Jul. 25, 1989) proposes effectively eliminating the speckles generated with the laser beam of high coherence in time and space emitted from the injection locking laser by means of beam vibration, i.e., two-dimensional movement of the beam in synchronization with the emitted pulses of the laser and in correspondence with the arrangement of elements of a lens member, such as a fly's eye lens, provided for obtaining uniform intensity distribution of the beam.

However, in such methods, it is difficult to obtain an appropriate amount of exposure within a short period, or the throughput has to be significantly reduced in order to secure the appropriate amount of exposure.

A high-power laser beam entering a fly's eye lens generates secondary light sources of an extremely high luminocity, which may cause destruction of optical components if such secondary light sources are focused thereon. Also weak reflected light, generated for example on a lens surface, if focused in the vicinity of the reticle, will be refocused on the wafer, thus generating a ghost image.

The first of the above-mentioned drawbacks of the fly's eye lens can be solved, as disclosed in the U.S. patent application Ser. No. 237,847 filed Aug. 26, 1988 (now U.S. Pat. No. 4,939,630 issued Jul. 3, 1990), by focusing the secondary light sources in a space outside the optical components. Also the latter of the drawbacks can be solved by a serial arrangement of two optical integrators, as disclosed in the U.S. Pat. No. 4,497,015.

However such double optical integrators give rise to the formation of speckles due to interference fringes. More specifically, the light fluxes emerging from the secondary light sources formed by the first optical integrator do not mutually interfere, but those from tertiary light sources formed by the second optical integrator interfere mutually for the following reason. The diameter of beams passing through the element lenses of the first integrator is expanded to about 10 times upon reaching the second integrator, so that the non-interfering distance of two light beams is also expanded to about 10 times. Thus the non-interfering distance becomes larger than the pitch of the element lenses of the second optical integrator, so that the tertiary light sources formed on the exit portions of the element lenses can mutually interfere.

SUMMARY OF THE INVENTION

An object of the present invention is to provide an illuminating apparatus capable of easily eliminating speckles without sacrificing efficiency of illumination.

The above-mentioned object can be attained, according to the present invention, by employing a stable resonator type laser equipped with a wavelength selecting element, and providing means for vibrating the beam one-dimensionally in a direction crossing the longer direction of the beam cross section, at at least one of the entrance side and exit side of the fly's eye lens or optical integrator.

The present invention also provides an illuminating optical apparatus comprising, between a first optical integrator (a fly's eye lens, a single rod or an optical fiber bundle) and a second optical integrator, means for deflecting the light flux entering the second optical integrator at least one-dimensionally.

The full deflection angle of the light flux needs only to be for a magnitude of moving the interference fringes, formed on a reticle R or a wafer W by a pitch. Also if the coherent beam is pulsed as in the excimer laser, it is effective to synchronize the change of deflection angle with the timing of the pulses. Such synchronization is unnecessary in the continuously oscillated laser beam, but the uniformity is improved if the rate of change of the deflection angle, or the moving speed in a direction perpendicular to the interference fringes formed on the illuminated member, is maintained substantially constant.

The present invention is applicable to optical working apparatus, illuminating apparatus for alignment and any other apparatus in which an object has to be illuminated with uniform light intensity distribution with a continuous or pulsed beam, for a certain period (requiring plural pulses in case of a pulsed beam).

As explained before, the interference fringes are generated by the interference of tertiary light sources generated by the second optical integrator. Consequently, during the illumination of the reticle (or wafer), the wave front of the light flux entering the second optical integrator is inclined to form phase differences of 2 m π (m=1, 2, 3, . . . ) among the tertiary light sources formed on the neighboring element lenses. Stated differently, an optical path difference of mλ, in which λ is the wavelength of the beam, is formed between the light fluxes entering the neighboring element lenses. The interference fringes have a periodic structure corresponding to the interval of the element lenses. Thus a change in the phase difference between the light fluxes from the neighboring tertiary light sources causes a movement of the interference fringes, and a change in the phase difference by 2 π causes the movement of fringes by a cycle.

Therefore the interference fringes can be smoothed after the illumination of a certain period, by a continuous or stepwise change of the phase by 2 π or 2 mπ during the illumination.

DESCRIPTION OF THE PREFERRED EMBODIMENTS

Figure 4:
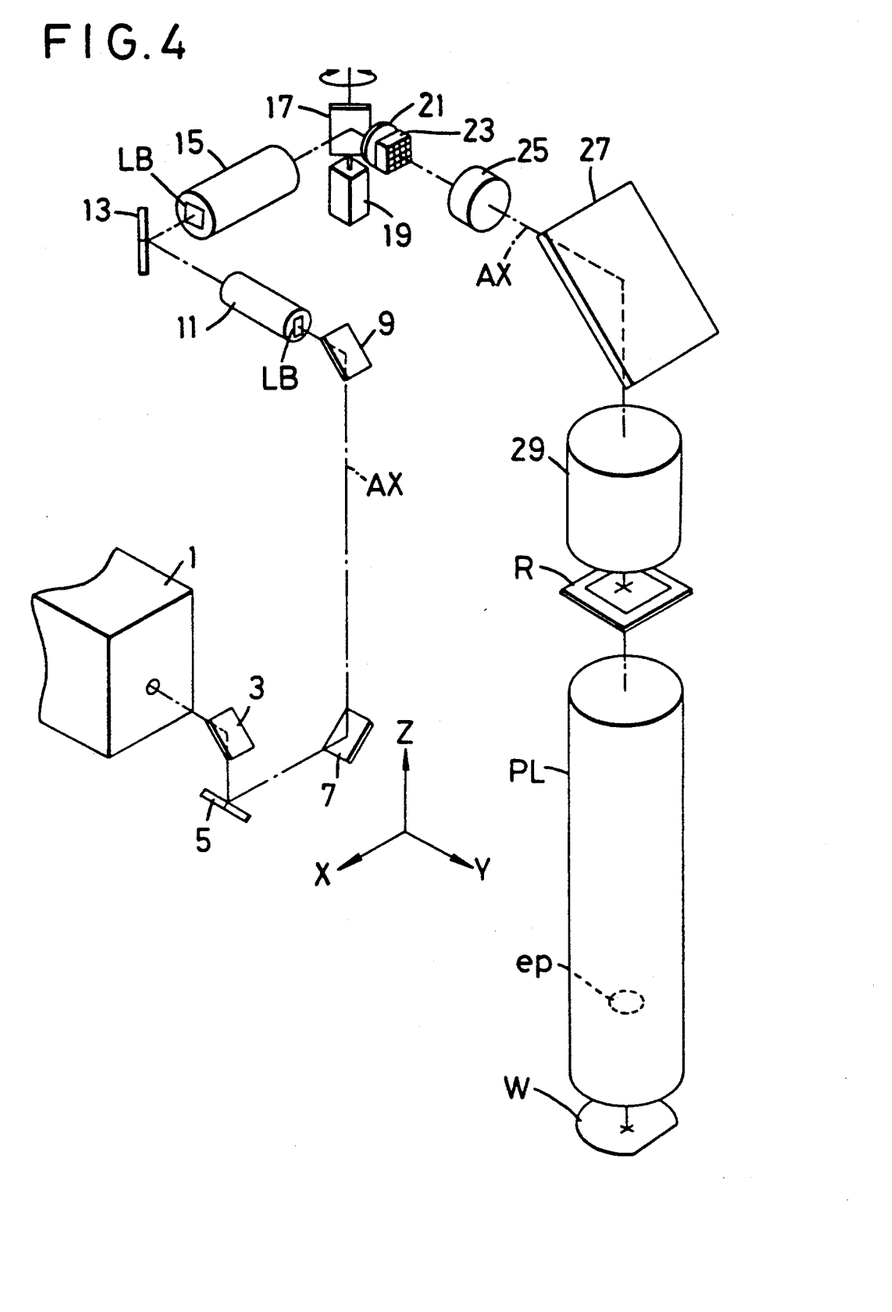
FIG. 4 is a perspective view of a first embodiment of the present invention.

FIG. 4 shows a first embodiment in which the illuminating apparatus of the present invention is applied to an exposure apparatus for integrated circuit manufacture. A KrF excimer laser 1 of stable resonance type equipped with a wavelength selecting element such as an etalon, diffraction grating or prism emits a beam with a cross section of vertically oblong rectangular shape. The laser beam is reflected by ultraviolet mirrors 3, 5, 7, 9 and enters a cylindrical lens 11, whereby the cross section of the beam is modified from rectangular shape to square shape. Then the beam is reflected by an ultraviolet lens 13, then enters a beam expander 15 and is emitted toward a scanning mirror 17 with a predetermined expanded beam diameter.

The cross section of a beam emitted from the excimer laser is generally rectangular with the vertical to horizontal ratio in a range from 1:2 to 1:5, so that the spatial coherence is not isotropic but is stronger in the shorter direction of the cross section than in the longer direction. For this reason speckles tend to appear in the shorter direction of the cross section of the beam. The speckle pattern formed by the beam emitted from the laser assumes a one-dimensional sinusoidal form of low contrast, or a grating-like interference pattern.

Figure 5:
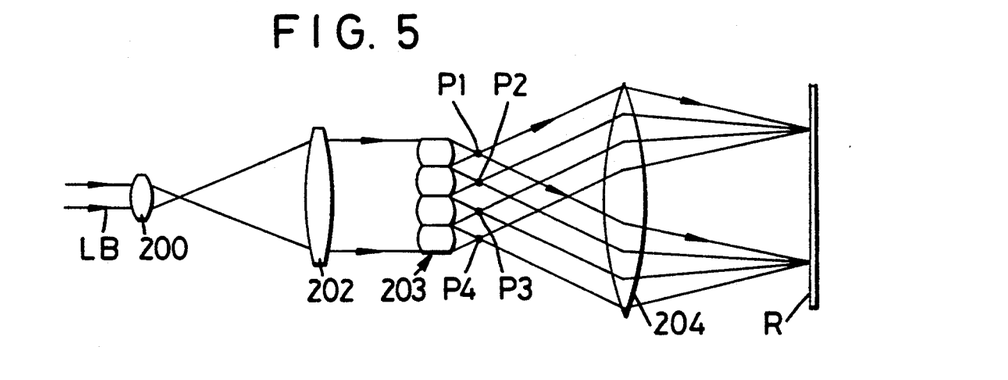
FIG. 5 is an optical path chart of the principal part of the first embodiment.
Figure 6:
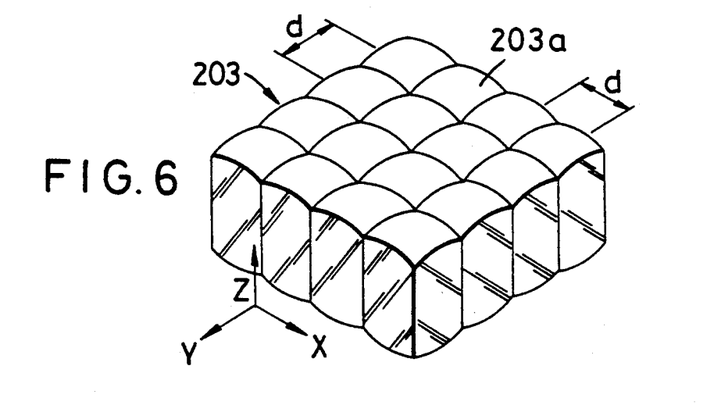
FIG. 6 is a perspective view of a fly's eye lens.

In the following there will be explained the cause of speckle formation and the method for eliminating the same. FIG. 5 schematically shows the arrangement of a beam expander (lenses 200, 202) for expanding a beam LB from the laser into a predetermined diameter, a fly's eye lens 203, a condenser lens 204, and a reticle R. FIG. 6 is a perspective view of the fly's eye lens 203, consisting of plural element lenses 203a arranged with a pitch d in the X, Y directions. The collimated beam from the lens 202 enters substantially the entire area of the fly's eye lens 203 to form, at the exit side thereof, secondary light sources $P_1, P_2, P_3, P_4, \ldots$ of a number corresponding to that of the element lenses 203a. The light fluxes from the secondary light sources are superposed, by the condenser lens 204, on the reticle R to obtain uniform illumination intensity. The light fluxes emerging from the secondary light sources $P_1$, $P_2$, $P_3$, $P_4$, ... toward the reticle R mutually interfere thereon, generating interference fringes.

Figure 7:
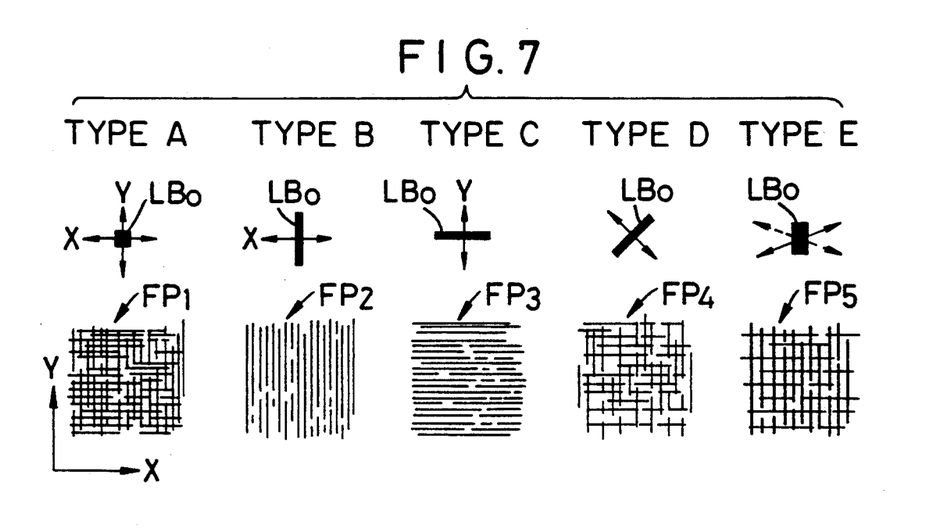
FIG. 7 is a view showing the relation between the cross sectional shape of the laser beam and interference fringes on the reticle.

If the original beam LB from the laser is sufficiently wide with low spatial coherence, the secondary light sources become mutually incoherent, and do not generate speckles. On the other hand, if the original beam LB is very fine, all the secondary light sources mutually interfere, thus generating a complex interference pattern of high contrast on the reticle R. If the original beam LB is of a certain size, the coherence of the secondary light sources becomes weaker. Thus, among the secondary light sources $P_1$, $P_2$, $P_3$, $P_4$, ..., only immediately neighboring ones of the pitch d mutually interfere, thereby generating speckles in the form of an interference pattern with a sinusoidal intensity distribution of low contrast. FIG. 7 shows speckle patterns obtained by passing beams with various cross sections through the fly's eye lens of the structure shown in FIG. 6.

Type A in FIG. 7 shows a case in which the cross section of the original beam $LB_0$ is very small both in horizontal X and vertical Y directions. Such beam generates interference fringes FP1 of an extremely high contrast both in the horizontal and vertical directions on the reticle R, corresponding to the directions (X, Y) of arrangement of the element lenses 203a. Such interference fringes FP1 stand still on the reticle R unless the beam entering the fly's eye lens is deflected, namely unless the secondary light sources are displaced in a plane perpendicular to the optical axis. In case of a pulsed beam such as that from the excimer laser, it is possible to vibrate the secondary light sources two dimensionally in the X, Y directions among plural pulses to displace the entire interference fringes FP1 for different pulses on the reticle R, whereby the interference fringes to which the photoresist is exposed are averaged on the substrate after a predetermined number of pulses, and the transfer of the reticle pattern is achieved as if the interference fringes are eliminated. However, if the cross section of the original beam $LB_0$ is extremely small in the X and Y directions as in Type A, the interference fringes FP1 have a very high contrast, so that it is necessary to select a sufficiently large vibrating amplitude for the secondary light sources and to use a large number of pulses.

Type B shows a case of a rectangular cross section of the original beam $LB_0$ oblong in the Y direction, generating vertical interference fringes FP2 extended in the Y direction on the reticle R. Such interference fringes FP2 can be eliminated, through integration on the photoresist, by vibration of the beam $LB_0$ in the horizontal (X) direction. Though the contrast of the fringes FP2 is relatively strong also in this case, the speckles can be satisfactorily eliminated by the one-dimensional beam vibration only.

Similarly Type C corresponds to a case of a horizontally oblong beam $LB_0$, generating horizontal fringes FP3 the reticle R. Such fringes can be eliminated by the vibration of the beam $LB_0$ in the Y-direction.

Type D shows interference fringes FP4 generated by a beam of rectangular cross section, inclined with respect to the fly's eye lens 203, for example 45° between the longer direction of the beam cross section and the X or Y-direction. The interference fringes FP4 appear horizontally and vertically in almost equal amounts along the directions of arrangement of the shortest pitch d of the element lenses 203a, but the contrast is lower than that in Type B or Type C. Consequently, speckles can be eliminated, as in Type B or C, by the vibration of the beam $LB_0$ in the shorter direction perpendicular to the longer direction.

Type E shows interference fringes FP5 generated with an original beam $LB_0$ which is vertically oblong but with a smaller vertical-to-horizontal ratio than in the Type B. In such case the interference fringes FP5 are composed not only of vertical fringes but also with a smaller amount of horizontal fringes of lower contrast. Consequently, the elimination of both fringes can be achieved by the vibration of the beam $LB_0$ not in the horizontal (X) direction but in a slightly inclined (to upper right or upper left as illustrated) direction.

Also in case of Type B or C, speckles can be eliminated by the vibration of the beam $LB_0$ in a direction inclined with respect to the X or Y direction. However, in case of Type A, a vibration in such inclined direction (ca. 45°) leaves speckles in diagonal directions, because the contrast of the speckles is high.

The above-mentioned types B, C, D and E relate to the present invention, but the arrangement of Type D has the highest percentage of speckle elimination, in consideration of the direction of arrangement of the element lenses in the fly's eye lens.

Since the spatial coherence of the beam is higher in the shorter direction of the beam cross section, as explained above, the scanning mirror 17 shown in FIG. 4 is so positioned that the vibrating axis thereof is parallel to the longer direction, or vertical direction, of the beam cross section before reforming by the cylindrical lens 11. The scanning mirror is connected to a vibration source 19 such as a galvanometer, a piezoelectric element or a torsion vibrator.

In this embodiment, the beam is vibrated by the scanning mirror 17 in a direction parallel with the shorter direction of the beam cross section. However, the vibrating direction of the beam need not be parallel to the shorter direction, but can be a direction suitably selected to cross the longer direction of the beam cross section. Thus the direction of the vibrating axis of the scanning mirror 17 is preferably not fixed but suitably inclined up to about 45°, according to the state of the speckle pattern to be eliminated.

Also, since the speckle pattern to be eliminated in the present invention is of a relatively low contrast, it is not always necessary to reciprocate the beam in a regular manner. For example if pulses required for obtaining appropriate exposure for the photoresist layer on the wafer W can be emitted within a single scan, the speckles may be eliminated by a swinging motion of the scanning mirror 17 in only one direction. The beam vibration is preferably synchronized with the oscillation of the laser beam, for example so as to cover 50 pulses in a single scanning.

The beam deflected by the scanning mirror 17 enters the fly's eye lens 23 for obtaining uniform illumination intensity, is then condensed by a condenser lens 25, is again reflected by an ultraviolet mirror 27, and enters a main condenser lens 29. The beam suitably condensed by the main condenser lens 29 uniformly illuminates reticle R, whereby the circuit pattern thereon is provided on a wafer W through a projection lens PL composed for example of quartz components.

The projection lens PL is telecentric on both sides or on one side (wafer side, and the exit plane of the fly's eye lens 23 is approximately conjugate with the pupil ep with respect to the condenser lens 25 and the main condenser lens 29. Thus images of the secondary light sources are formed on the pupil ep, corresponding to the number of the lens elements of the fly's eye lens 23.

Now there will be explained the relation between the beam vibrated by the scanning mirror 17 and the fly's eye lens 23. In the present embodiment, the fly's eye lens 23 is composed of a plurality of square rods each having spherical convex end faces, in which the convex face at the entrance side has a focal length approximately equal to the length of a square rod or the thickness of the fly's eye lens.

Figure 8:
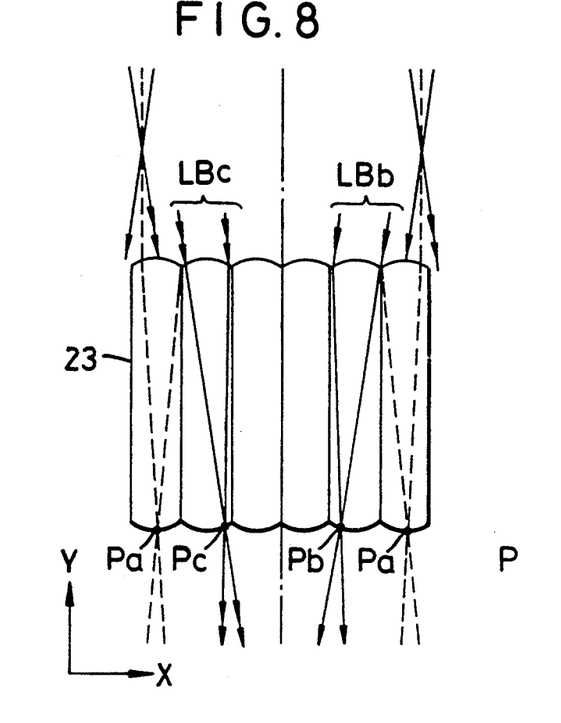
FIG. 8 is an optical path chart in the fly's eye lens.

FIG. 8 shows the optical path of the beam in the fly's eye lens 23. The entrance end of the lens receives a substantially collimated beam with an incident angle varied by the scanning mirror 17. FIG. 8 shows only 6 element lenses for the purpose of simplicity. The element lenses at the left and right sides illustrate the secondary light sources $P_a$ formed by an incident beam parallel to the optical axis. The second element lens from the right illustrates the secondary light source $P_b$ formed by an incident beam $LB_b$ inclined to the left by a predetermined angle, and the second element lens from the left illustrates the secondary light source $P_c$ formed by an incident beam $LB_c$ inclined to the right by a predetermined angle. These point light source images $P_a$, $P_b$, $P_c$ are formed by the convergence of a collimated beam on the exit end of the element lenses or in the space slightly outside the exit end.

Although the beam $LB_c$ or $LB_b$ is shown only on one element lens, it is to be understood that such beams enter all the element lenses under the same condition.

As will be apparent from the foregoing, the point light source image at the exit end of each element lens moves in the order of $P_b$ - $P_a$ - $P_c$ - $P_a$ - $P_b$ in the X-direction, in response to the vibration of the scanning mirror 17.

Figure 9:
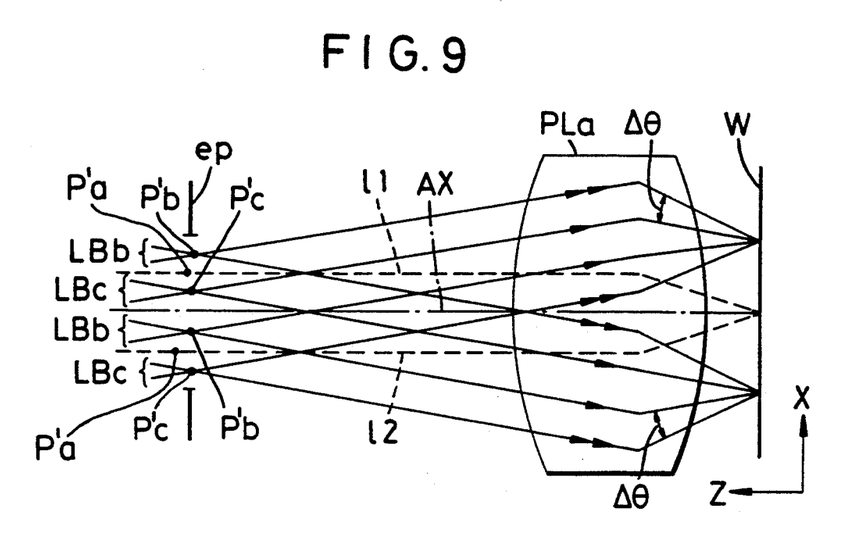
FIG. 9 is an optical path chart in a projection lens.

FIG. 9 shows the optical path of the beam in a lens system $PL_a$ from the exit pupil ep of the projection lens PL to the wafer W. The beams $LB_b$, $LB_c$ and the point light source images $P'_a$, $P'_b$, $P'_c$ respectively correspond to $LB_b$, $LB_c$, $P_a$, $P_b$, $P_c$ in FIG. 8, and $l_1$, $l_2$ indicate principal rays passing through $P'_a$ and parallel to the optical axis AX. Again the vibration of the scanning mirror 17 causes the movement of the point light source image in the sequence of $P'_b$ - $P'_a$ - $P'_c$ - $P'_a$ - $P'_b$, whereby the incident angle of the beam reaching the wafer W varies in a small range of $\Delta\theta$. Consequently the spatial coherence of the beam on the wafer W is reduced by integration, so that the formation of interference fringes is reduced.

The speckle reduction is dependent on the angular variation of the beam, or the amount of movement of the point light source image on the exit end of the aforementioned element lens, and the effective number of the element lenses or the number of point light source images formed on the pupil ep. Therefore, for effective speckle elimination, the vibration of the scanning mirror 17 is conducted in consideration of these conditions. The same consideration applies also when the laser beam is continuous.

Figure 10:
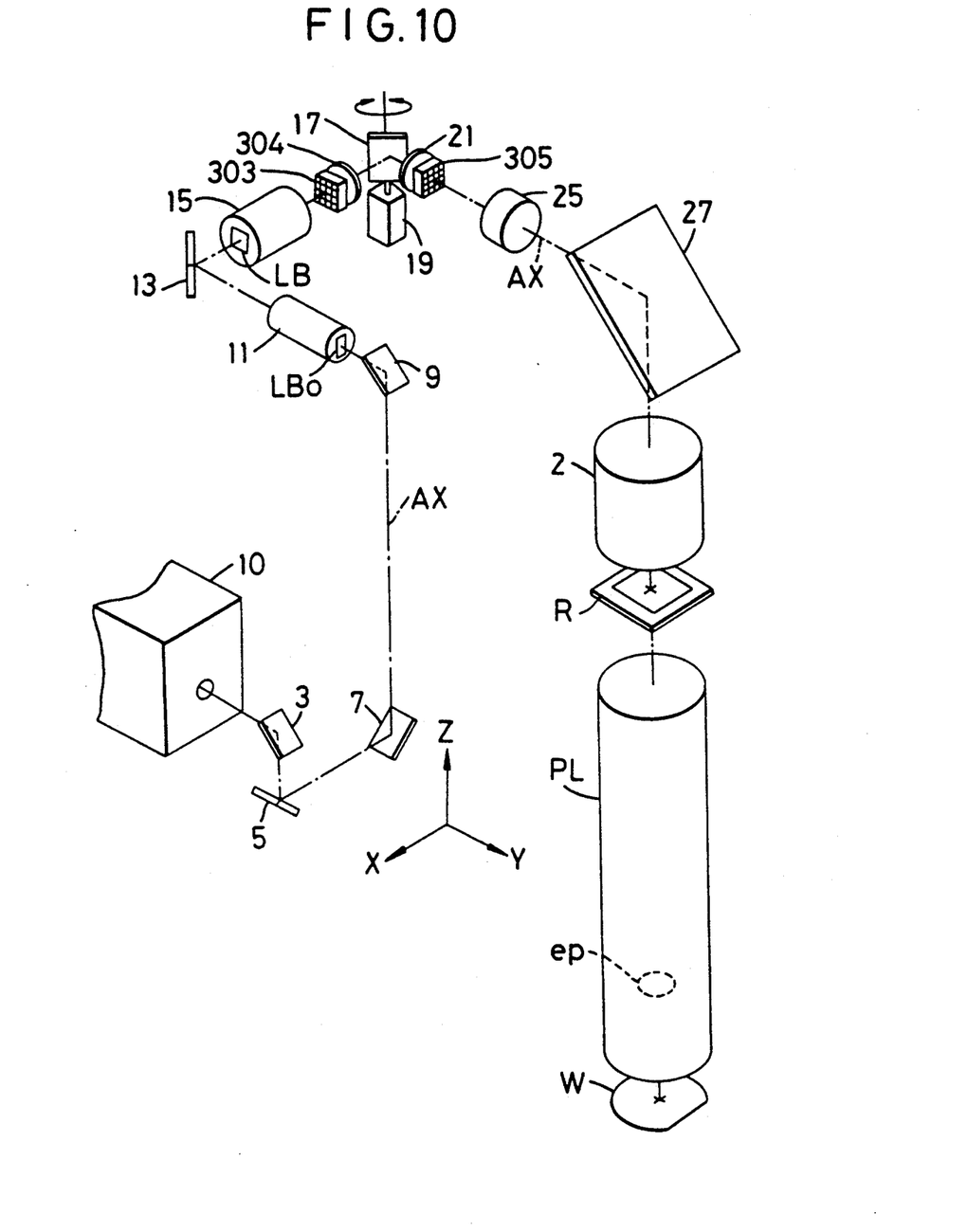
FIG. 10 is a perspective view of a second embodiment of the present invention.

In the following there will be explained a second embodiment of the present invention with reference to FIG. 10, wherein the same components as those in FIG. 4 are represented by the same numbers or symbols.

Figure 11:
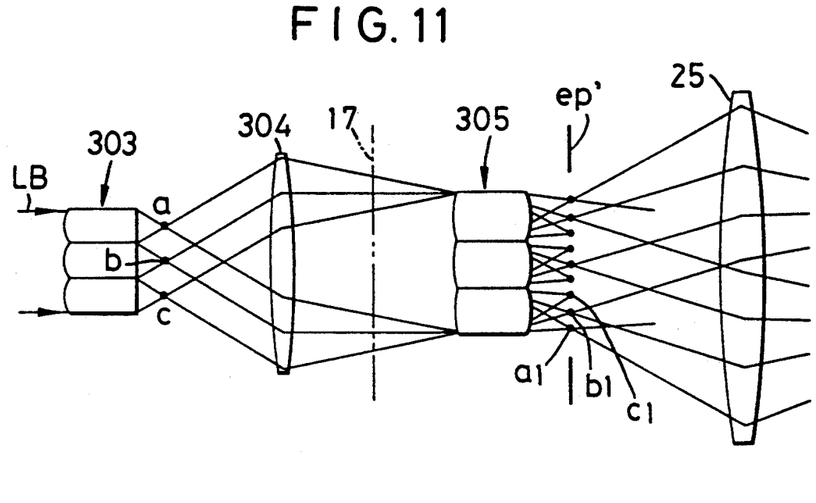
FIG. 11 is an optical path chart in the principal part of the second embodiment.

The beam expanded by the beam expander 15 enters an optical integrator shown in FIG. 11.

Referring to FIG. 11, each element lens of a first fly's eye lens 303 has a spherical face at the entrance side of the beam LB and a flat exit face to form a secondary light source a, b or c in the air. A condenser lens 304 is spaced from secondary light sources a, b, c and is spaced from the entrance end of a second fly's eye lens 305 by the focal length of condenser lens 304 in order to effectively introduce light from the secondary light sources a, b, c to the said second fly's eye lens 305. Each element lens of the fly's eye lens 305 has a spherical entrance face of a radius R1 of curvature and a spherical exit face of a smaller radius R2 of curvature so as to form tertiary light sources $a_1$, $b_1$, $c_1$ in the air. The diverging beams from the tertiary light sources are transmitted by the condenser lens 25 shown in FIG. 10 and combined on the reticle R to obtain uniform illumination intensity. The plane ep' of the tertiary light sources is conjugate with the pupil ep of the projection lens PL, and also with the plane of the secondary light sources a, b, c. In FIG. 11 the lens 21 shown in FIG. 10 is omitted.

Figure 12:
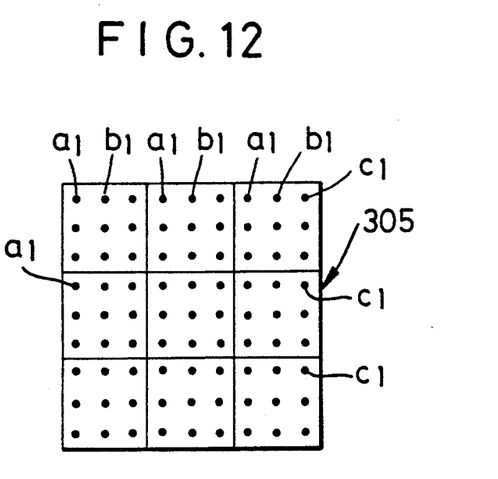
FIG. 12 is a plan view showing an arrangement of tertiary light sources.

FIG. 12 shows the exit plane of the second fly's eye lens 305 having, for example 9 element lenses arranged in a 3×3 matrix. If the first fly's eye lens 303 also has 9 element lenses arranged in a 3×3 matrix, each element lens of the fly's eye lens 303 produces 9 tertiary light sources at the exit side. Thus, corresponding to each secondary light source, for example a, there are formed tertiary light sources $a_1$ in corresponding positions on the exit face of 9 element lenses of the fly's eye lens 305. In this manner there are formed 81 tertiary light sources arranged in a 9×9 matrix, on the exit side of the fly's eye lens 305.

Each fly's eye lens typically has about 10×10 element lenses. Consequently the number of secondary light sources is 100, and that of the tertiary light sources increases to 100×100, and the intensity of each tertiary light source is reduced to about 1/100 in comparison with that in the first fly's eye lens.

It is therefore possible to solve the problems of optical element destruction, ghost image etc.

It is also effective to provide a lens close to the entrance end of the fly's eye lens 305 in order to minimize light loss by diffusion. It is furthermore effective to provide a field lens close to the tertiary light sources $a_1$, $b_1$, $c_1$.

In the following there will be explained the function of the present embodiment.

In the present embodiment, since the spatial coherence of the original beam $LB_0$ is low, the fly's eye lens can be manufactured with practical dimensions and number of element lenses, by selecting the pitch in such a manner that the secondary light sources a, b, c formed by the first fly's eye lens do not mutually interfere. However, in the second fly's eye lens, if the dimensions of the element lenses are so determined that the tertiary light sources $a_1$ (or $b_1$ or $c_1$) do not mutually interfere, the external size of the fly's eye lens becomes larger than that of the first fly's eye lens 303, and in extreme cases about 10 times as large, particularly in a direction corresponding to the shorter direction of the cross section of the beam $LB_0$. This is practically intolerable in designing the apparatus, and interference between the tertiary light sources $a_1$ (or likewise $b_1$ or $c_1$) is therefore unavoidable. Thus the smoothing of interference fringes is conducted, as will be explained in the following, by producing a phase difference $2m\pi$ between the tertiary light sources $a_1$ (or likewise $b_1$ or $c_1$) formed by neighboring element lenses of the second fly's eye lens 305. It is to be noted that the tertiary light sources $a_1$, $b_1$ and $c_1$ formed by an element lens of the second fly's eye lens 305 are mutually incoherent, as long as the secondary light sources a, b and c are mutually incoherent.

Figure 13A:
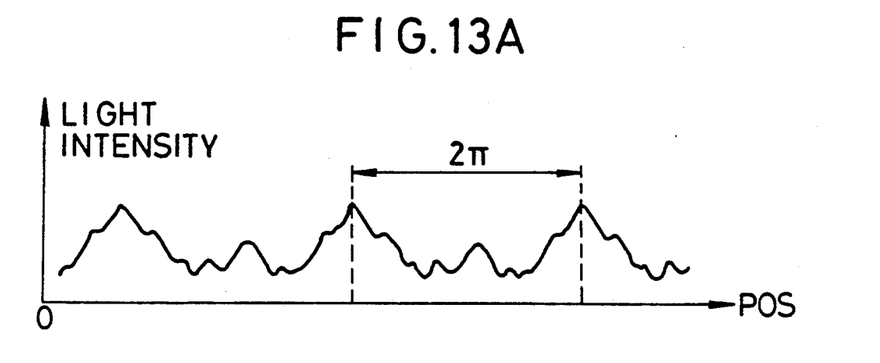
FIGS. 13A, 13B and 13C are charts showing light intensity distribution on an object to be illuminated.
Figure 13B:
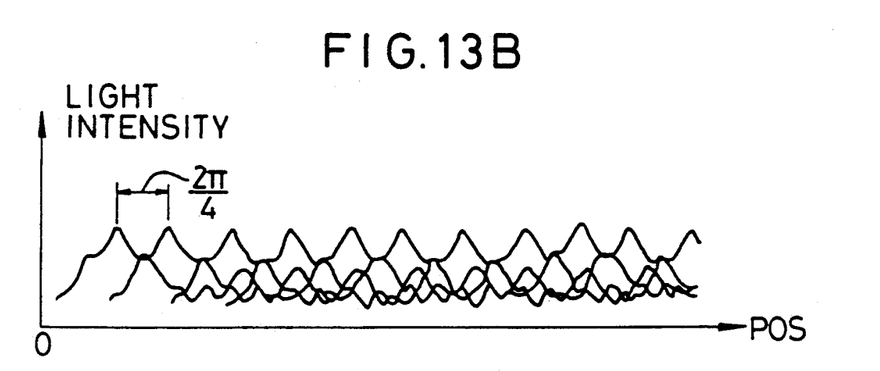
Figure 13C:
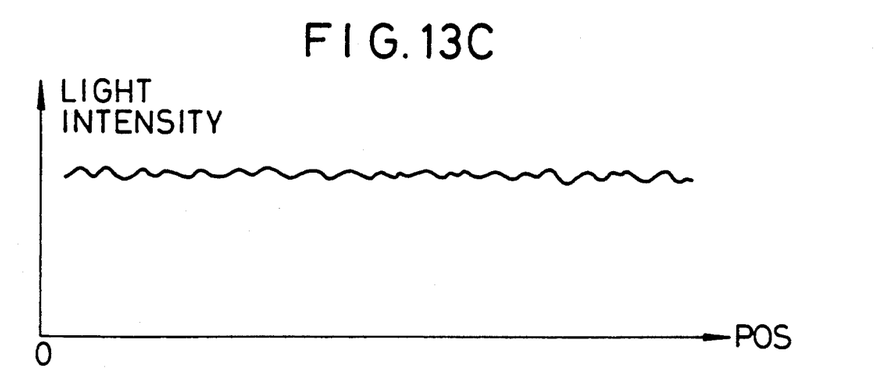

Since the excimer laser is pulsed, the phase change is not continuous but stepwise. However, there can be obtained a similar result as in the case of continuous phase change, by taking a certain large number of pulses, as schematically shown in FIGS. 13A to 13C. FIG. 13A schematically shows one-dimensional periodic distribution of the intensity of the interference fringes. FIG. 13B shows the state of speckles formed, on the wafer, by four pulses of the excimer laser beam, with a stepwise increase of phase difference by $2\pi/4$ between the neighboring element lenses of the fly's eye lens. The addition or integration of speckles results in the smoothing of speckles as shown in FIG. 13C. More strictly the result is represented as a constant intensity with certain superposed ripple components. The smoothing becomes more complete with increase of the number of pulses, but is practically sufficient with several tens of pulses.

Figure 14:
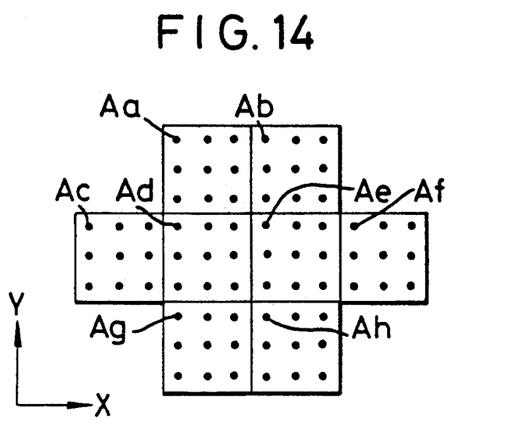
FIG. 14 is a plan view showing another arrangement of tertiary light sources.

Let us further consider the state of interference of the tertiary light sources. If the element lenses of the fly's eye lens 305 are regularly arranged in the X and Y directions as shown in FIG. 14, and the longer direction of cross section of the laser beam $LB_0$ from the laser 10 lies in the Y direction, the tertiary light sources images Aa, Ad and Ag formed by three element lenses in the Y-direction can be mutually incoherent, as the laser beam $LB_0$ has low spatial coherence in the Y-direction. However the tertiary light source images Ac, Ad, Ae and Af formed, from the light of the secondary light source a, by four element lenses in the X-direction mutually interfere, as the laser beam has relatively high spatial coherence in the X-direction.

The interference of tertiary light sources Ac, Ad, Ae and Af varies depending on the conditions of the system, and includes, for example, a case in which the interference takes place between the tertiary light sources of immediately adjacent element lenses, such as Ac and Ad, but not between those of more distant element lenses, such as between Ac and Ae or Af; a case of interference among three neighboring light sources such as Ac, Ad and Ae; and a case of mutual interference among all the tertiary light sources Ac, Ad, Ae and Af formed by the element lenses arranged in the X-direction.

Figure 15:
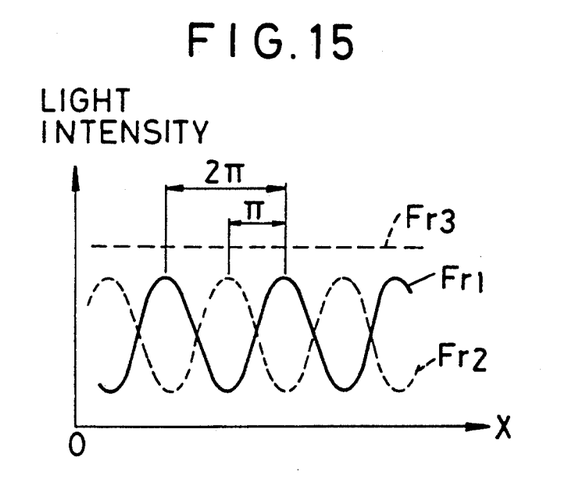
FIG. 15 is a chart showing intensity distribution of interference fringes.

FIG. 15 shows the intensity distribution $Fr_1$ of interference fringes on the reticle R or wafer W formed only by interference of the tertiary light sources of immediately neighboring element lenses (for example Ac and Ad, Ad and Ae, and Ae and Af), and the distribution is theoretically sinusoidal.

In such case, if two pulses are emitted from the laser 10 with different angles of the scanning mirror 17 so as to form a phase difference of $\pi$ (or $2K\pi+\pi$ in which $K=1, 2, 3, \ldots$) between the mutually interfering tertiary light sources, the intensity distribution $Fr_2$ of the interference fringes formed by the second pulse is exactly displaced by a half pitch, and theoretically a flat distribution $Fr_3$ is obtained by the superposition of these curves. In practice, however, the intensity distribution assumes a complex form as shown in FIG. 13A, because of mutual interference of a certain number of tertiary light sources arranged in the X-direction. However, mathematical analysis indicates that, even in case of mutual interference of n tertiary light sources arranged in the X-direction (for example Ac, Ad and Ae, or Ad, Ae and Af), a flat superposed intensity distribution can be obtained by emitting a beam of n pulses in synchronization with the angular change of the scanning mirror 17 in such a manner that each of n tertiary light sources changes the phase by $2\pi/n$, or the interference fringes on the reticle R move by 1/n of the pitch. Consequently, if the fly's eye lens 305 has n element lenses in the X direction, unevenness in the exposure in the exposed area of the wafer W resulting from interference fringes is reduced with n pulses of the same intensity during the vibration of a half cycle of the scanning mirror 17, corresponding to movement of the fringes by a pitch.

In such case, however, it is necessary to correlate the angular change of the scanning mirror 17 very precisely with the timing of the triggers for the pulses.

As another approach, the exposure can be made with a number of pulses sufficiently larger than n during the vibration of a half cycle of the scanning mirror 17. For example, for a fly's eye lens 305 having 10 element lenses in the X-direction (n=10), there can be emitted about 50 pulses during the vibration of a half cycle of mirror 17. This method is more advantageous in designing of the apparatus, as the angular change of the scanning mirror 17 need not be exactly correlated with the triggers for the pulses. Also the appropriate exposure can be easily achieved by experimentally determining the minimum number Nmin of pulses required for the smoothing of interference fringes during the half cycle of the scanning mirror and regulating the amount of light of each pulse in such a manner that the number of entire pulses required for the exposure of a shot becomes equal to $m \times Nmin$ ($m=1, 2, 3, \ldots$).

In the present embodiment the scanning mirror is vibrated only one-dimensionally in the shorter direction (perpendicular to the longer direction) of the cross section of the beam $LB_0$, because interference fringes are formed one-dimensionally by the arrangement of the tertiary light sources formed by the fly's eye lens 305 in the X-direction. If interference takes place also among the tertiary light sources arranged along the longer (Y) direction of the cross section of the beam $LB_0$, the vibration of the scanning mirror 17 can be effected two-dimensionally based on the same principle. In such case the tertiary light sources simultaneously move by a small amount on the pupil ep, in a similar manner as in raster scanning. It is also possible, instead of causing two-dimensional vibration in the scanning mirror 17, to use two vibrating mirrors respectively vibrating parallel to the X and Y directions.

In the present embodiment, the longer direction of the cross section of the beam $LB_0$ from the laser 10 is made parallel to a direction (Y) of arrangement of the element lenses of each fly's eye lens, but this is not essential and an arbitrary relation can be adopted. However, in any relation, at least one of the vibrating directions of the beam, caused by the vibration of the scanning mirror 17, crosses the longer direction of the cross section of the original beam $LB_0$.

Figure 16:
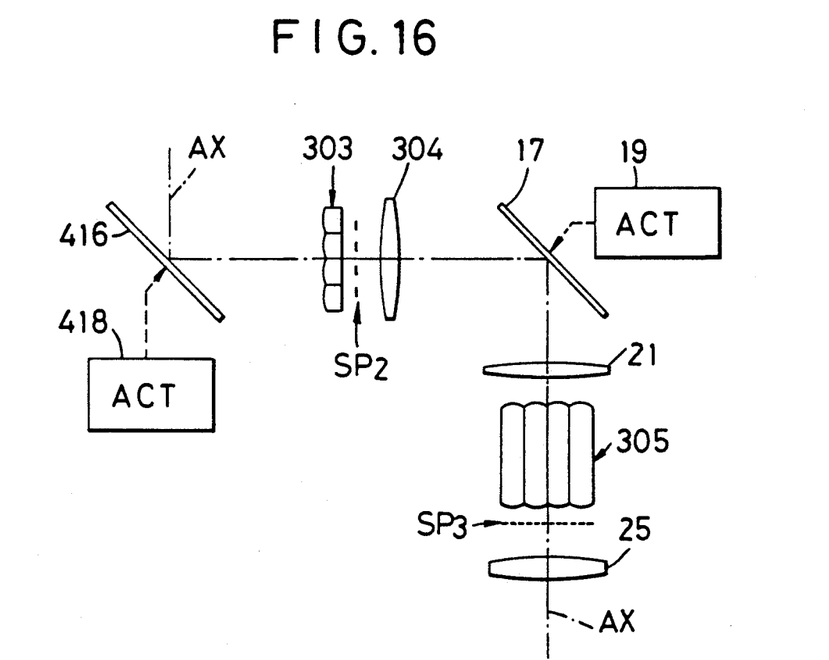
FIG. 16 is an optical path chart showing the principal part of a third embodiment of the present invention.

In the following there will be explained a third embodiment of the present invention, with reference to FIG. 16. This embodiment is different from the second embodiment in that a scanning mirror 416 and a vibration source 418 therefor are provided also in front of the first fly's eye lens 303.

Also in the present embodiment, the laser 10 is a stable resonance type KrF excimer laser with an incorporated wavelength selecting element. It is assumed that the emitted laser beam $LB_0$ has a rectangular cross section, wherein the spatial coherence in the longer direction is low enough not to form interference fringes even through double integrators, but in the shorter direction is considerably high.

The plural secondary light source images (light spots) formed on a plane $SP_2$ in the air by the first fly's eye lens 303 may mutually interfere depending on the conditions. In such case, the interference naturally takes place among the tertiary light sources $a_1$ (or likewise $b_1$ or $c_1$) in the corresponding positions of the element lenses of the second fly's eye lens 305, but also takes place among the tertiary light sources $a_1$, $b_1$ and $c_1$ formed by each element lens.

The plane $SP_2$ of the secondary light source images is conjugate with the plane $SP_3$ of the tertiary light source images. In addition, the image magnification of each element lens of the second fly's eye lens is relatively large as it has to refocus all the secondary light source images formed on the exit side of the first fly's eye lens. For example, if the fly's eye lenses are the same in the diameter of the element lenses and have ten element lenses in one direction of arrangement, the magnification becomes equal to 10 times.

Consequently the minimum angular change of the scanning mirror 17 required for smoothing the speckle pattern generated by the mutual interference of the tertiary light sources Ac, Ad, Ae and Af shown in FIG. 14 is unable to eliminate the influence of the mutual interference of the secondary light sources.

It is therefore possible to consider enlarging the range of angular change of the scanning mirror 17, for example by 10 times. However such wide vibration of the scanning mirror 17 is not desirable because of the possibility of partial eclipse of the light beam entering the fly's eye lens 305. Such partial eclipse of the light beam entering the fly's eye lens 305 on both ends of the vibrating motion of the scanning mirror 17 directly results in an error in the exposure to the wafer W or a reduced throughput.

In the present embodiment, therefore, the beam entering the first fly's eye lens 303 is vibrated by the scanning mirror 416, thereby varying the phase difference between the secondary light sources in a range of $2 m\pi$ during plural pulses. Naturally the beam vibration by the scanning mirror 17 is conducted simultaneously, as in the second embodiment.

The interference fringes formed on the reticle R (or wafer W) by mutual interference of the secondary light sources is the same as that explained in relation to FIG. 15, but has a pitch about ten times as large as that of the interference fringes formed by mutual interference of the tertiary light sources, due to the difference in magnification between the first and second fly's eye lenses. Consequently, if the interference takes place only between the secondary light sources of the immediately neighboring element lenses of the first fly's eye lens 303, there are obtained interference fringes as shown in FIG. 17, composed of superposition of a sinusoidal intensity distribution $Fr_0$ of a longer pitch and an intensity distribution $Fr_4$ of a shorter pitch.

Figure 17:
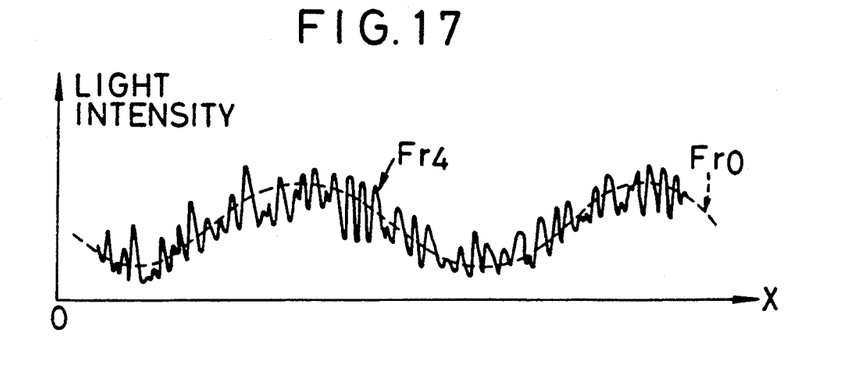
FIG. 17 is a chart showing light intensity distribution on an object to be illuminated.

In case of the interference fringes as shown in FIG. 17, the scanning mirror 416 can be vibrated at least in two angular positions so as to give a phase difference of $\pi$ to mutually interfering two secondary light sources. More specifically several tens of pulses are emitted while the scanning mirror 17 is vibrated over a half cycle (or about one cycle) at a certain angular position of the scanning mirror 416, and the procedure is repeated at another angular position, giving a phase difference of $\pi$, of the scanning mirror 416.

If the spatial coherence of the beam $LB_0$ becomes higher, three or more of the secondary light sources a, b, c mutually interfere, so that the angular change of the scanning mirror 416 has to be made in smaller portions. In this manner the vibration of the scanning mirror 17 over a half cycle (or a full cycle) is repeated for each angular change of the scanning mirror 416.

If about 50 pulses are given during a half cycle of the scanning mirror 17, the exposure of an area on the wafer may require at least $50 \times 10 = 500$ pulses, as the scanning mirror 416 may require at least 10 angular changes, corresponding to the number of element lenses of the fly's eye lens 303 in the direction of interference. This corresponds to a light intensity per pulse of 1/5 to 1/10, in comparison with that in the second embodiment. Since the general repeating frequency of the excimer laser is in the order of 100 to 200 Hz, the exposure of a shot may require as long as 2.5 to 5 seconds, resulting in a significant loss in throughput. It is therefore desirable, as explained before, to exactly synchronize, as far as possible, the angular change of the scanning mirror 17 with the timing of triggers of the pulses, thereby minimizing the number of pulses to be irradiated during the half cycle of the scanning mirror 17 and to precisely control the angular change of the scanning mirror 416. In this manner throughput is not reduced significantly in comparison with the embodiment shown in FIG. 10.

The present embodiment explained above can satisfactorily smooth the speckle pattern, even when a laser of high spatial coherence, such as the injection locking laser shown in FIG. 2, is employed. Also the interference fringes or random speckle pattern can satisfactorily be smoothed if the scanning mirrors 416 and 17 are vibrated two-dimensionally.

In the present embodiment, the vibration sources 418, 19 and the trigger circuit (not shown) for the laser 10 are simultaneously controlled by suitable control means.

Figure 18:
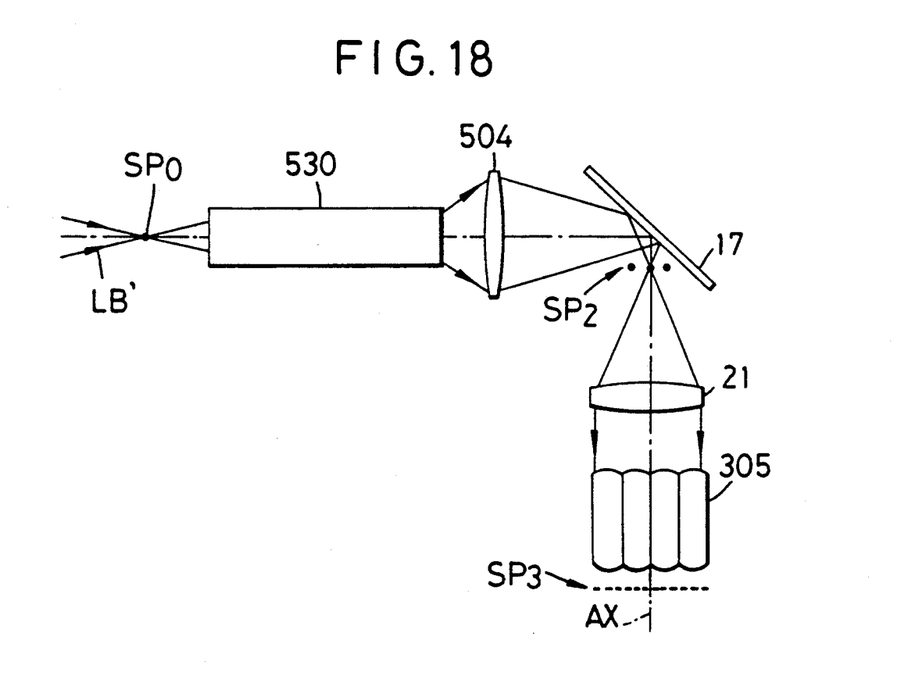
FIG. 18 is an optical path chart showing the principal part of a fourth embodiment of the present invention.

In the following there will be explained a fourth embodiment of the present invention, with reference to FIG. 18, in which a quartz square rod 530 is employed as a first optical integrator. The beam $LB_0$ from the laser 10 is converted by a suitable optical system into a converging beam $LB'$ and enters the entrance end of the rod 530, slightly behind the converging point $SP_0$. The beam $LB'$ repeats multiple reflections in the rod 530, diverges from the other end and enters a lens 504. The beam passing through the lens 504 is reflected by the scanning mirror 17 and converges on a plane $SP_2$ in the air to form plural secondary light sources thereon. The light then enters a lens 21, and the light beams from the secondary light sources are respectively converted into substantially parallel beams (with slightly different angles) and enter the fly's eye lens 305 functioning as a second optical integrator. In this embodiment, by means of the multiple reflections of the beam $LB'$ in the rod 530, a converging point $SP_0$ is refocused as plural points on the plane $SP_2$.

In addition to the above-explained embodiments, there may be employed a bundle of optical fibers as the first optical integrator and a fly's eye lens as the second. Also the element lenses of the fly's eye lenses may have a honeycomb (hexagonal) structure and may be prepared from a single quartz material.

The present invention is applicable not only to reduction projection exposure apparatus but also to any apparatus requiring illumination with uniform intensity distribution.

Also in the foregoing embodiments, a scanning mirror is provided between the first and second optical integrators, but it is possible to provide a scanning mirror also behind the second optical integrator, with a constant period of vibration.

What is claimed is:

1. An illuminating optical apparatus comprising:
   light source means for emitting a laser beam having a cross section longer in a first direction than in a second direction substantially perpendicular to the first direction;
   means for expanding the cross section of said laser beam in said second direction, thereby to modify the cross section of said laser beam;
   optical means for receiving the modified cross section laser beam at an entrance side of the optical means and for re-forming the light intensity distribution of the modified cross section laser beam so as to provide at an exit side of said optical means a light intensity distribution that is substantially uniform throughout the modified cross section of the laser beam; and
   means provided at at least one of the entrance side and the exit side of said optical means for periodically deflecting the path of the laser beam in a direction crossing said first direction.

2. An apparatus according to claim 1, wherein said light source means emits a laser beam of a relatively high spatial coherence in said second direction.

3. An apparatus according to claim 1, wherein said optical means comprises integrator means for forming plural light source images from said laser beam and superposing the light from said plural light source images on an object to be illuminated.

4. An apparatus according to claim 1, wherein said light source means comprises a stable resonance type laser equipped with a wavelength selecting element.

5. An apparatus according to claim 1, wherein said deflecting means deflects the path of said laser beam in a direction substantially perpendicular to said first direction.

6. An apparatus according to claim 1, wherein said deflecting means is provided on an optical path between said light source means and said optical means, for varying the incident angle of said laser beam into said optical means.

7. An illuminating optical apparatus according to claim 1, wherein said expanding means comprises a cylindrical lens.

8. An illuminating optical apparatus according to claim 1, wherein said deflecting means deflects the path of said laser beam in a direction crossing said first direction obliquely.

9. An illuminating optical apparatus according to claim 1, wherein said deflecting means deflects the path of said laser beam in a direction crossing said first direction at 45 degrees.

10. An illuminating optical apparatus according to claim 1, wherein said deflecting means comprises a vibrating optical element.

11. An illuminating optical apparatus comprising:
    light source means for emitting a coherent beam, the cross section of said coherent beam being oblong so that the spatial coherence is stronger in the shorter direction of the cross section than in the longer direction of the cross section;
    beam expanding means for expanding said coherent beam at least in the shorter direction of the cross section to convert the coherent beam from said light source into substantially square cross section;
    integrator means for forming plural secondary light source from said square cross section beam;
    scanning means provided at least at one of the entrance side and the exit side of said integrator means for periodically deflecting the light beam in the direction crossing said longer direction of the cross section; and
    optical means including condensor lens means for uniformly condensing the deflected light beam on an object surface to be illuminated.

12. An illuminating optical apparatus according to claim 11, wherein said scanning means includes a deflecting mirror arranged at the entrance side of said integrator means for periodically deflecting the light beam from said beam expanding means in the direction crossing said longer direction of the cross section.

13. An illuminating optical apparatus according to claim 12, wherein said integrator means includes plural element lenses arranged in x and y orthogonal directions, and said deflecting mirror deflects the light beam in a direction parallel to one of said x and y orthogonal directions.

14. An illuminating optical apparatus according to claim 12, wherein said integrator means includes plural element lenses arranged in x and y orthogonal directions, and said deflecting mirror deflects the light beam in a direction inclined to said x and y orthogonal directions.

15. An illuminating optical apparatus according to claim 11, wherein said optical means further includes another integrator means for forming plural light source images as plural tertiary light sources from each of beams from said plural secondary light sources, and wherein said condenser lens means super-imposes the beams from said plural tertiary light sources on said object surface to be illuminated.

16. An illuminating optical apparatus according to claim 15, wherein said scanning means includes a deflecting mirror arranged between the first recited integrator means and the second recited integrator means for periodically deflecting the light beam from the first recited integrator means in a direction crossing said longer direction of the cross section of the light beam emitted from said light source means.

17. An illuminating optical apparatus according to claim 16, wherein each integrator means includes plural element lenses arranged in x and y orthogonal directions, and said deflecting mirror deflects the light beam in a direction parallel to one of said x and y orthogonal directions.

18. An illuminating optical apparatus according to claim 16, wherein each integrator means includes plural element lenses arranged in x and y orthogonal directions, and said deflecting mirror deflects the light beam in a direction inclined to said x and y orthogonal directions.

19. An illuminating optical apparatus comprising:
    light source means for emitting a coherent beam;
    optical means comprising first integrator means for forming plural secondary light source means from said coherent beam and second integrator means for forming plural tertiary light source beams from each of said secondary light source beams;

means for superposing said plural tertiary light source beams on an object to be illuminated; and means provided between said first and second integrator means for periodically deflecting, at least one-dimensionally, a light path of said plural secondary light source beams.

20. An illuminating optical apparatus according to claim 19, wherein said deflecting means comprises a vibrating optical element.

21. An illuminating optical apparatus according to claim 19, wherein said light source means emits a laser beam having a spatial coherence in a first cross sectional direction of said laser beam that is higher than the spatial coherence in a second cross sectional direction of said laser beam substantially perpendicular to said first direction, and said deflecting means deflects said light path in a direction crossing said second direction.

22. An illuminating optical apparatus according to claim 21, further comprising means for expanding the cross section of said laser beam in said first direction so as to modify the cross section of said laser beam.

23. An illuminating optical apparatus according to claim 19, further comprising another deflecting means provided between said light source means and said first integrator means for periodically varying an incident angle of said coherent beam onto said first integrator means.

* * * * *